United States Patent

Brajal et al.

[11] Patent Number: 5,598,436
[45] Date of Patent: Jan. 28, 1997

[54] DIGITAL TRANSMISSION SYSTEM WITH PREDISTORTION

[75] Inventors: Américo Brajal, Villeneuve-Le-Roi; Antoine Chouly, Paris, both of France

[73] Assignee: U.S. Philips Corporation, New York, N.Y.

[21] Appl. No.: 268,079

[22] Filed: Jun. 28, 1994

[30] Foreign Application Priority Data

Jun. 29, 1993 [FR] France .................................. 93 07922

[51] Int. Cl.⁶ ...................................................... H04K 1/02
[52] U.S. Cl. .......................... 375/297; 375/260; 375/285; 370/207; 330/284
[58] Field of Search ..................................... 375/259, 260, 375/285, 296, 297, 344, 345; 455/63, 103, 104; 370/70–73, 23, 19, 20, 30, 69.1, 120–123; 330/10, 284, 302, 304, 149

[56] References Cited

U.S. PATENT DOCUMENTS

| | | | |
|---|---|---|---|
| 3,974,448 | 8/1976 | Baum | 455/13.1 |
| 4,890,300 | 12/1989 | Andrews | 375/297 |
| 5,093,637 | 3/1992 | Isota et al. | 332/103 |
| 5,162,748 | 11/1992 | Katz | 330/149 |
| 5,282,222 | 1/1994 | Fattouche et al. | 375/200 |
| 5,291,148 | 3/1994 | Reisner et al. | 330/149 |

FOREIGN PATENT DOCUMENTS 94201788 10/1994 European Pat. Off. .

OTHER PUBLICATIONS

"Principles of Modulation and Channel Coding for Digital Broadcasting for Mobile Receivers" N. Alard et al, EBU Review– Technical, No. 224, Aug. 1987, pp. 168–190.

"Adaptive Linearization of Power Amplifiers in Digital Radio Systems" A.A.M. Saleh et al, Bell System Technical Journal vol. 62 (1983) pp. 1019–1033.

*Primary Examiner*—Stephen Chin
*Assistant Examiner*—Amanda T. Le

[57] ABSTRACT

Digital signal transmission system operating with constellation coding, the system comprising an orthogonal frequency-division multiplexing modulation unit which generates multicarrier signals, and an amplifier which causes signal distortion. The system comprises a predistortion circuit inserted between the multicarrier modulation unit and the amplifier, the circuit predistorting the multicarrier signals received on an input, in opposite sense to distortions created by the amplifier, and generating predistorted multicarrier signals so that, after the predistorted multicarrier signals passing through the amplifier, the amplifier delivers undistorted multicarrier signals. The system may operate in the fixed mode or in the adaptive mode.

5 Claims, 7 Drawing Sheets

DIGITAL TRANSMISSION SYSTEM WITH PREDISTORTION

BACKGROUND OF THE INVENTION

The invention relates to a digital signal transmission system operating with constellation coding, the system comprising an orthogonal frequency-division multiplexing (OFDM) modulation unit which generates multicarrier signals, and an amplifier which causes signal distortion.

The digital transmission system can be used for transmitting digital television signals (audio and/or video) to portable receivers, mobile receivers or others.

The document "Principles of modulation and channel coding for digital broadcasting for mobile receivers" by N. Alard and R. Lasalle, EBU Review-Technical, No. 224, August 1987, Brussels (Belgium), is known. This document describes the orthogonal frequency-division multiplexing modulation technique which consists of frequency-division multiplexing various orthogonally modulated carriers, for example, by symbols from a constellation. Such a technique is very robust with respect to fading of the received signal when the transmission channel is modified.

The multicarrier modulation technique, for example, implementing Orthogonal Frequency-Division Multiplexing, will hereinafter be referred to as OFDM.

When the OFDM signals are formed, they are to be transmitted through a channel and are therefore to be amplified by a power amplifier. A particularly critical point for microwave links and transmission either by satellite or groundbased channel is the non-linearity of the transmitter power amplifier or of the on-board power amplifier in the case of satellite transmissions. These amplifiers are known for their non-linear characteristics. If they are used in their linear zones, their power is not completely employed. If they are made to operate near their saturation power level, they unacceptably distort the signal. In practice, with a given power amplifier, the level of the transmitted signal is fixed to establish a compromise between the signal-to-noise ratio and the non-linear distortion the signal is subjected to. Thus, the optimum operating point of the amplifier is the one at which the compound effects of additive noise of the channel and non-linear distortion of the amplifier are minimized. For modulations with a large number of states this point lies far from the saturation power level of the amplifier, which means that the latter is not used efficiently. In the case of a monocarrier system, predistortion techniques (fixed or adaptive) are currently used to increase the system efficiency, which techniques make it possible to reduce the effect of the non-linearity of the power amplifier on the transmitted signal.

In the case of a monocarrier system, a known technique consists of modifying the alphabet of transmit data. This technique called "data predistortion technique" or "baseband predistortion technique" is known from the article by A. A. M. Saleh and J. Salz "Adaptive linearization of power amplifiers in digital radio systems", Bell System Technical Journal, Volume 62, April 1993, pages 1019/1033. In the case of modulations with a large number of states, for example, a two-carrier quadrature amplitude modulation (QAM64, QAM256), the amplifier influences the constellation by producing a net compression and a net rotation of the points having a large amplitude. To compensate for this effect, the original constellation is distorted in such a way that it returns to its original square shape after its passing through the power amplifier.

Such a predistortion technique which influences a monocarrier system cannot be applied to a multicarrier system. In effect, with a monocarrier system the predistortion is effected in the symbols of the constellation. If the same technique is applied to each of the carriers of an OFDM system, distortions due to intercarrier interference which cannot be corrected will appear on the output of the amplifier. This intercarrier interference is created between the transmitted symbols by other carriers. On the other hand, a multicarrier system is much more sensitive than a monocarrier system to non-linearities of the amplifier, because the peak amplitudes are much larger for OFDM signals than for monocarrier signals.

SUMMARY OF THE INVENTION

It is an object of the invention to realise an arrangement which makes it possible to effect a specific predistortion in a multicarrier system while avoiding the drawbacks defined above.

This object is achieved with a system comprising a predistortion circuit inserted between the multicarrier modulation unit and the amplifier, said circuit predistorting the multicarrier signals received on an input, in opposite sense to distortions created by the amplifier, and generating predistorted multicarrier signals so that, after their passing through the amplifier, the amplifier delivers undistorted multicarrier signals.

Thus, not the symbols from the constellation are distorted, but the OFDM signals comprising all the modulated carriers. This offers the advantage of suppressing the distortion due to interference between modulated carriers.

Preferably, the predistortion circuit predistorts the amplitude and phase of the multicarrier input signal as a function of its radial amplitude.

More particularly, the predistortion circuit comprises:

means for sampling and quantifying the input signals, means for predistorting polar amplitude and phase values of the input signals, means for generating in-phase and quadrature components of the predistorted signals.

The predistortion circuit may comprise at the input a cartesian/polar converter unit for converting the sampled input signals.

The predistortion circuit may likewise comprise an adaptation circuit which calculates the differences between the input signals of the circuit and the output signals of the amplifier and which adapts the predistortion means to reduce these differences. The system may thus be adapted to fluctuations of the amplifier due to, more specifically, variations of temperature, ageing or other processes.

These different aspects of the invention and other aspects will become apparent and be explained with the aid of embodiments to be described hereinafter.

BRIEF DESCRIPTION OF THE DRAWINGS

The invention will be better understood with the aid of the following Figures given by way of non-limiting examples, which represent in.

DETAILED DESCRIPTION OF THE PREFERRED EMBODIMENT

Figure 1A:
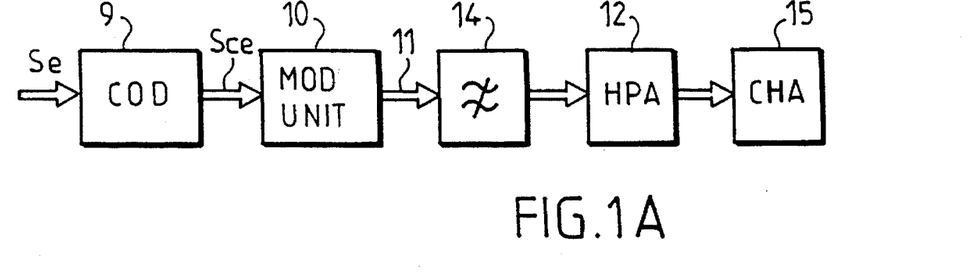
FIG. 1A: a block diagram of a transmitter assembly for digital transmission.
Figure 1B:
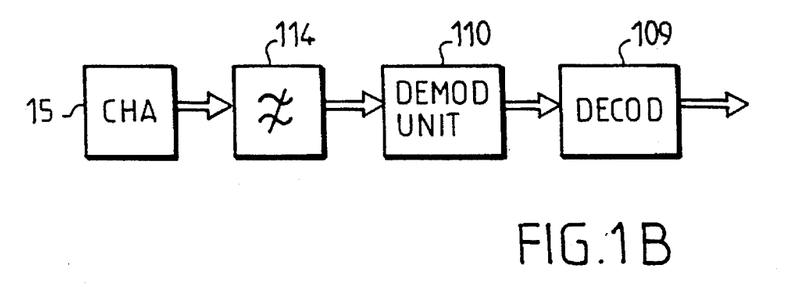
FIG. 1B: a block diagram of a receiver for reception of digital transmission.
Figure 3A:
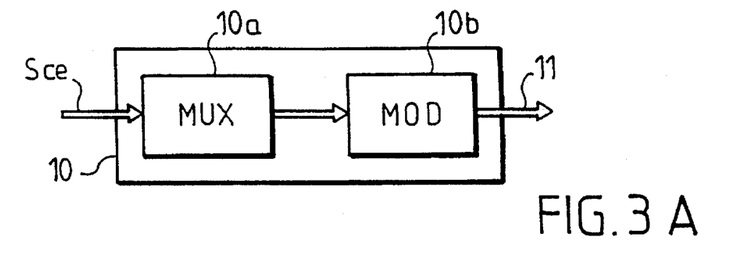
FIG. 3A: a block diagram of an OFDM modulation unit OFDM demodulation unit.

FIGS. 1A and 1B shows a processing circuit of a digital transmission system. On transmission (FIG. 1A) it comprises in a series combination: coding means COD 9 for transmit symbols Se, a modulation unit MOD UNIT 10, a low-pass filter 14 and a power amplifier HPA 12. A transmission channel CHA 15 transmits signals coming from the transmission circuit. In the case of an OFDM modulation (FIG. 3A), the symbols Sce coming from the coding means are multiplexed by a multiplexer MUX 10a and are then used to modulate carrier signals in a modulator 10b. The OFDM signals thus obtained (link 11) are amplified, after filtering, by the amplifier 12 to produce OFDM transmit signals (FIG. 1A).

On reception (FIG. 1B), the system comprises a filter 114, a demodulation unit DEMOD UNIT 110 followed by a decoder DECOD 109. The demodulation unit 110 comprises (FIG. 3B) a demodulator DEMOD 110a and a demultiplexer DEMUX 110b.

On transmission, the amplifier 12 distorts the OFDM signals both with respect to amplitude and phase. These distortions are analyzed in FIG. 2.

Figure 2:
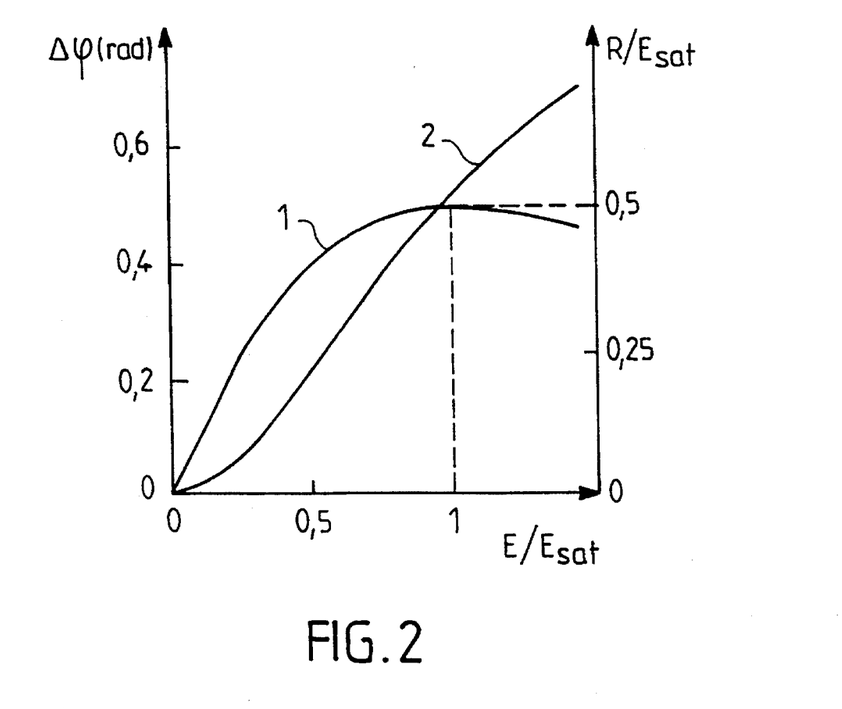
FIG. 2: two curves indicating the amplitude distortion and phase distortion caused by the output amplifier.

Curve 1 represents along the X-axis the amplitude of signal E and along the Y-axis (to the right) the amplitude of signal R, respectively, at the input and output of the amplifier 12 and (to the left) the phase shift $\Delta\phi$ in radians. The two axes relating to the amplitude have graded amplitude values normalised with respect to the input value $E_{sat}$ which produces a maximum output signal. It is noted that with low values of the input signal E, the output signal R is more or less proportional thereto, after which the output signal R is saturated and exceeds a maximum value when the input signal E increases. This progressive saturation causes distortion.

Similarly, it is noted (curve 2) that a phase shift $\Delta\phi$ is generated by the amplifier. With low values of the input signal E this phase shift $\Delta\phi$ is zero or very low, after which it increases to a saturation value when the input signal E increases. These two curves are characteristic of an amplifier which comprises a travelling wave tube, but similar curves are noticed with other power amplifiers.

Figure 4:
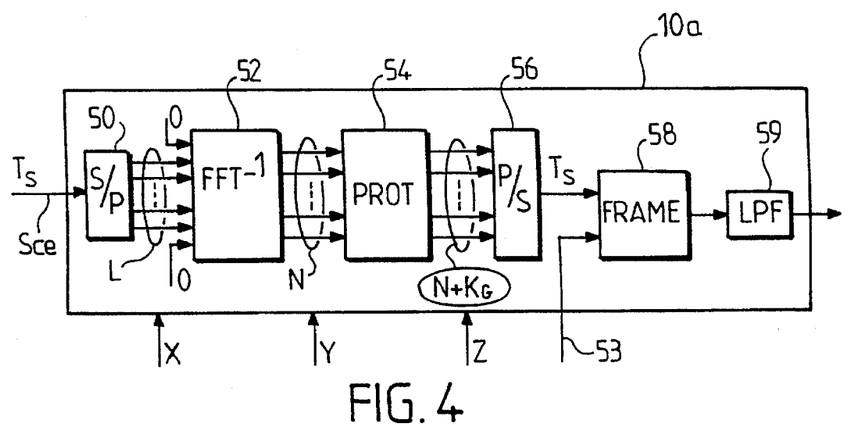
FIG. 4: a diagram of an OFDM multiplexer.

FIG. 4 is an example of a basic circuit diagram of an OFDM multiplexer 10a. The digital data representing the coded transmit signals Sce, coming from coder 9 undergo series-parallel conversion in a unit S/P 50. Let us consider L consecutive symbols transmitted at a rate $1/T_S$ to be transmitted on L carriers. Unit 50 performs a series-parallel conversion and produces in parallel L symbols which are fed to a unit $FFT^{-1}$ 52 which performs an $N^{th}$-order inverse Fourier transform of $N=2^k>L$, where K is an integer. Therefore, the L symbols are completed by a number of L1=(N−L)/2 "0" data on either one of the two sides of input 52 (referenced X). If NL is odd, the beginning or the end of the block receives one more symbol. The N symbols (referenced Y) which leave unit 52 are in their turn completed in a protection unit PROT 54 by $K_G$ symbols which corresponds to a guard time of $\Delta=K_G.T_S$ which forms protection. The $K_G$ symbols correspond to a copy of the last symbols of N symbols described before. These $K_G$ symbols are prefixed to the N symbols to form a data block of $(K_G+N)$ transmit symbols (referenced Z). A parallel-series converter unit P/S 56 performs the parallel-series conversion of the $(K_G+N)$ symbols. The successive blocks of $(K_G+N)$ OFDM symbols are then organised in OFDM frames in a unit FRAME 58. The latter adds special symbols 53 (synchronisation, wobulation or other symbols) which are used, for example, for synchronising transmission and reception or for channel estimation. A low-pass filter LPF 59 filters the signals before they are transmitted by the modulator.

Figure 3B:
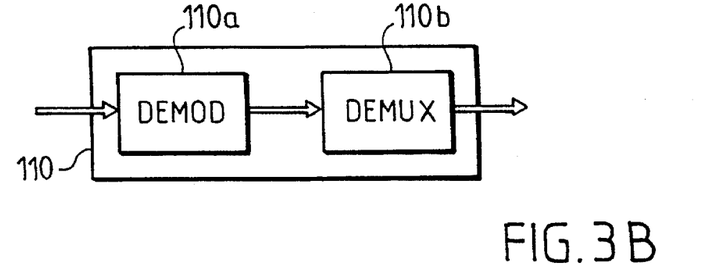
FIG. 3B: a block diagram of an OFDM demodulator unit.
Figure 5:
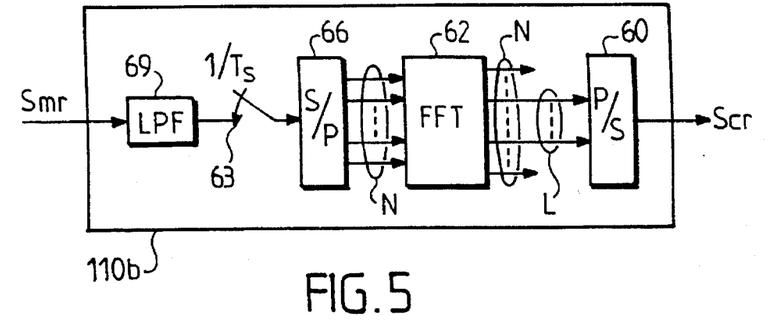
FIG. 5: a diagram of an OFDM demultiplexer.

On reception, the received modulated symbols Smr are demodulated in a demodulation unit 110 (FIG. 3-B) which comprises a demodulator DEMOD 110a and an $OFDM^{-1}$ demultiplexer DEMUX 110b which performs a reverse process to the one performed on transmission. The demultiplexer 110b comprises in a series combination (FIG. 5):

a low-pass filter LPF 69;

a sampler 63 having the rate $1/T_S$;

a series-parallel converter unit S/P 66 which produces N payload symbols and which thus does not take $K_G$ symbols into account which are received during the guard time, a direct Fourier transform calculation device FFT 62 which produces a sequence of N symbol blocks.

a parallel-series converter unit P/S 60 which influences these L symbols and produces received coded symbols Scr. These symbols enter a decoder DECOD 109 (FIG. 1B).

The ends of the blocks of N symbols are abandoned, so that only the central portion comprising L symbols is left.

If one wished to use the known monocarrier predistortion technique in the case of multicarrier modulation, this would necessitate the predistortion of each carrier before unit 52 of multiplexer 10a. This method causes distortion to appear on the output of the receiver due to intercarrier interference which is impossible to correct.

Figure 6A:
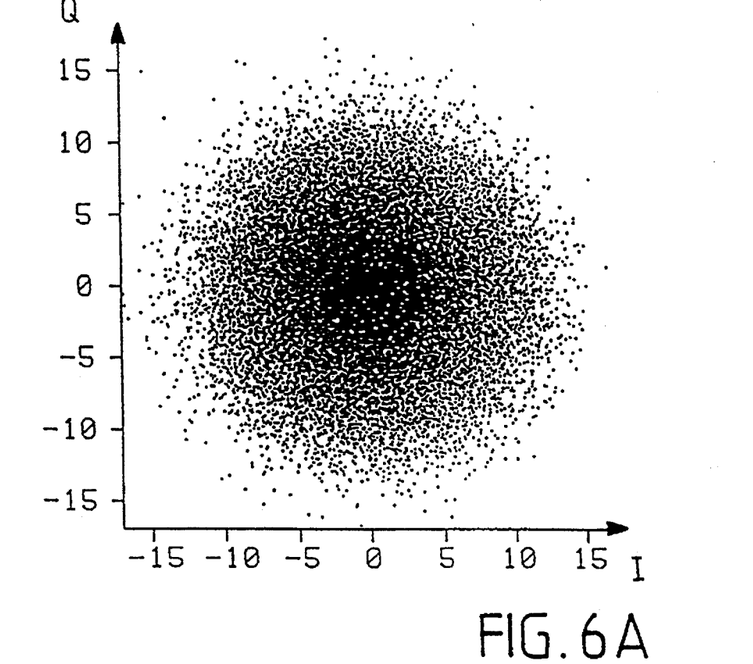
FIG. 6A: the distribution of the OFDM signal at the output of the OFDM modulator.

When one examines the distribution of the OFDM signal in the case of a 16 QAM modulation, one will notice a real part I/imaginary part Q distribution represented in FIG. 6A. This is a Gaussian distribution with a zero mean value. It is symmetrical around the value of (0,0).

Figure 6B:
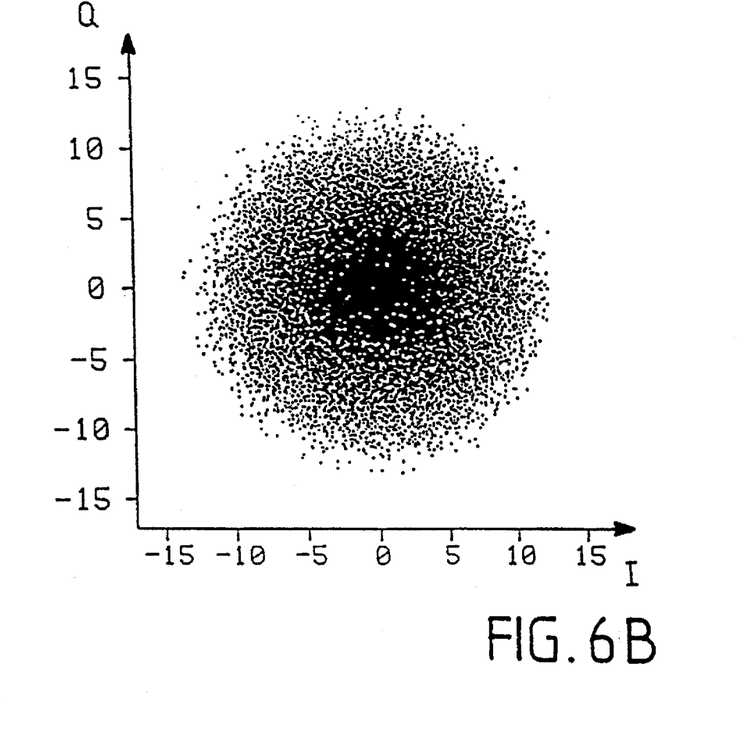
FIG. 6B: the distribution at the output of the amplifier.

The OFDM signal on the output of the amplifier as the I/Q distribution represented in FIG. 6B. This distribution is no longer Gaussian, for the amplifier is a non-linear device, so that the amplitude at the output of the amplifier is limited to $E_{sat}/2$.

Figure 7:
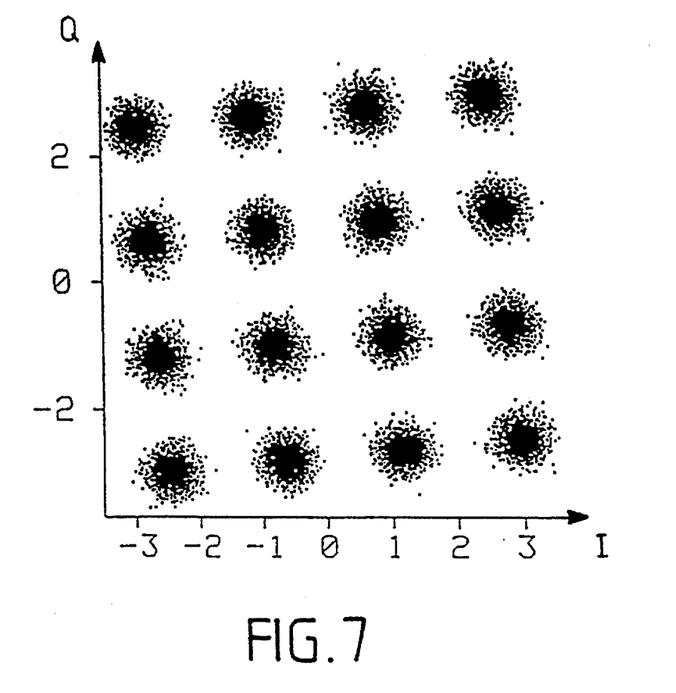
FIG. 7: a situation of a QAM16 constellation at the demodulation output, without the predistortion circuit according to the invention.
Figure 8:
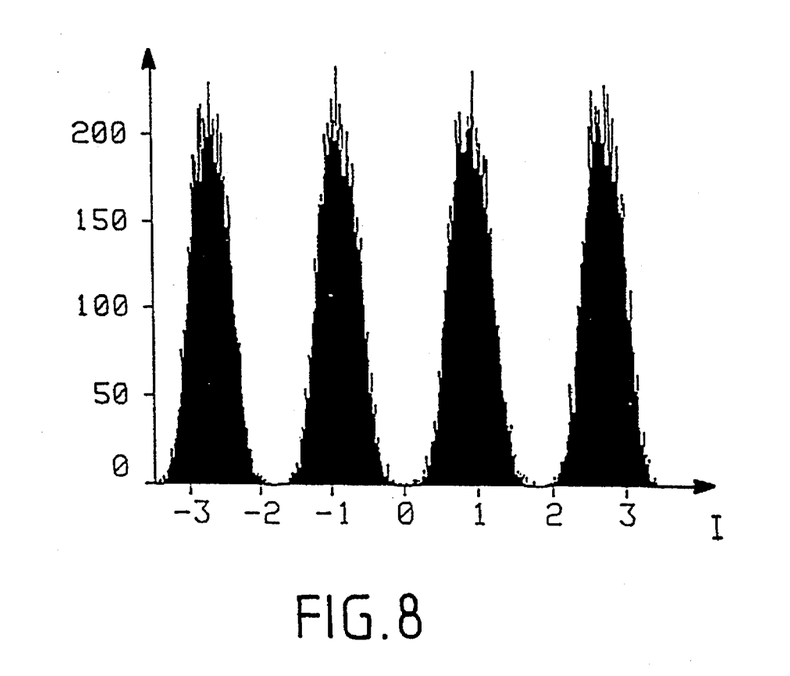
FIG. 8: a histogram of the real portion of the signals received at the demodulation output.

When one observes a 16 QAM constellation as it appears on reception at the output of the demodulation unit, the diagram of FIG. 7 is obtained. In the case of a mono carrier system, a 16 QAM constellation is formed by stains more or less oblong depending on their position in their constellation. Contrary hereto, in the case of a multicarrier system, one will observe that:

the clouds of received points have a circular form, thick towards the centre of each cloud. Each cloud has an almost Gaussian distribution, these clouds have the same spreading, whatever the transmitted symbol. Thus all the symbols are influenced the same, all the clouds of points undergo an identical rotation and an identical scaling factor, the constellation retains more or less a square form. Everything takes place as if the square grid forming the constellation had undergone a rotation around the point of origin. The uniform distribution of the points in each cloud is distinct from the histogram of the real portion of the received signal shown in FIG. 8 for a 16-QAM constellation. The four distributions in the form of a bell indicate the symmetrical distribution of points. These non-centred distributions around the values of −3, −1, 1, 3 underline the rotation of the constellation.

Figure 9:
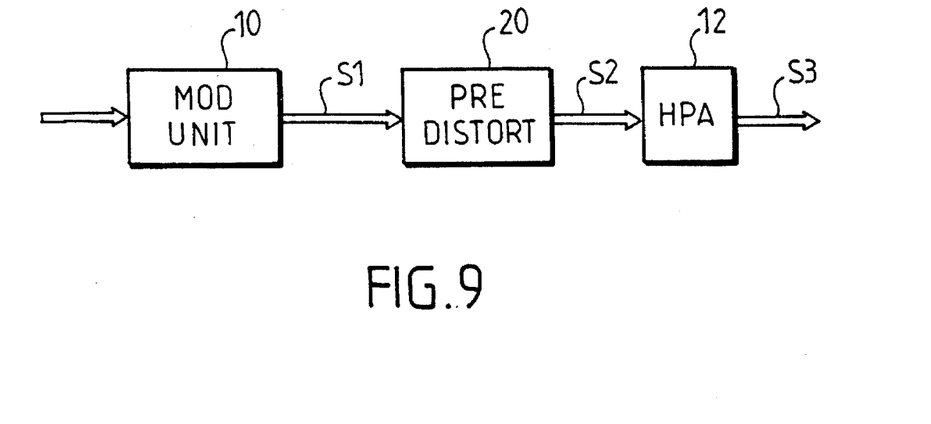
FIG. 9: a predistortion circuit according to the invention inserted between a modulation unit and the amplifier.

To correct, according to the invention, the distortion caused by the amplifier in OFDM modulation, a predistortion circuit 20 is inserted between the output of the OFDM modulator 10 and the input of the amplifier 12 (FIG. 9). The predistortion circuit influences the OFDM signal by performing a predistortion which takes into account the amplitude of said signal. Similarly, the OFDM modulator supplies a first OFDM signal S1 which enters the predistortion circuit. This predistortion circuit supplies a second OFDM signal S2 predistorted in such a way that after the predistorted OFDM signal has passed through the amplifier, the latter supplies a third undistorted OFDM signal S3. This non-distortion remains restricted to the dynamic range of the amplifier.

Figure 10A:
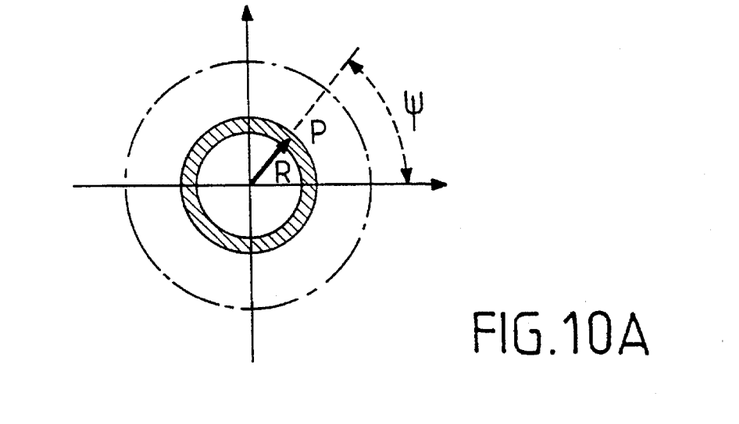
FIG. 10A: a ring-shaped part of the stain on the output of the amplifier and in this ring-shaped part a point of the stain before predistortion.
Figure 10B:
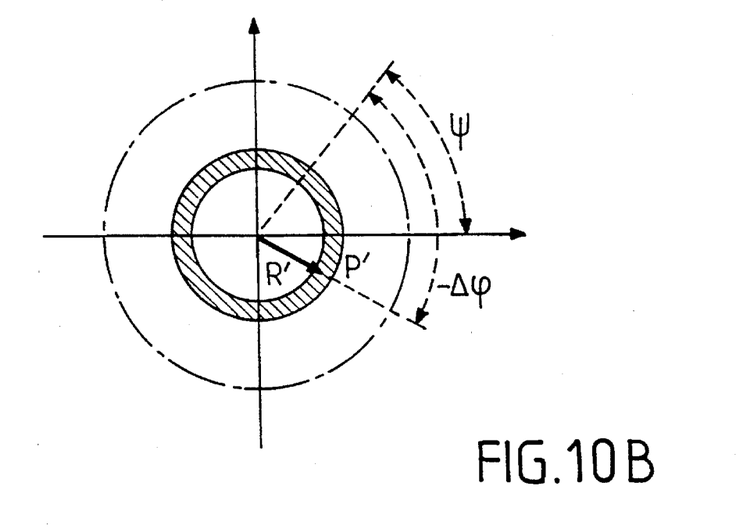
FIG. 10B: the point in the ring-shaped part of the stain after predistortion.

To effect the predistortion, the distribution (FIG. 6A) of the first OFDM signal is, according to the invention, broken into a series of consecutive rings. FIG. 10A represents one of these rings. The broken line circle represents the maximum amplitude of the signal. A point P' having amplitude R' and additional phase shift $-\Delta\phi$ is made to correspond to a point P of the ring having amplitude R and phase $\psi$ (FIG. 10-B). The values of R' and $-\Delta\phi$ so as a function of R are determined according to the characteristics of the relevant amplifier. The predistortion then consists of substituting point P' having characteristics (R', $\psi-\Delta\phi$) for a point P having characteristics (R, $\psi$).

Figure 11:
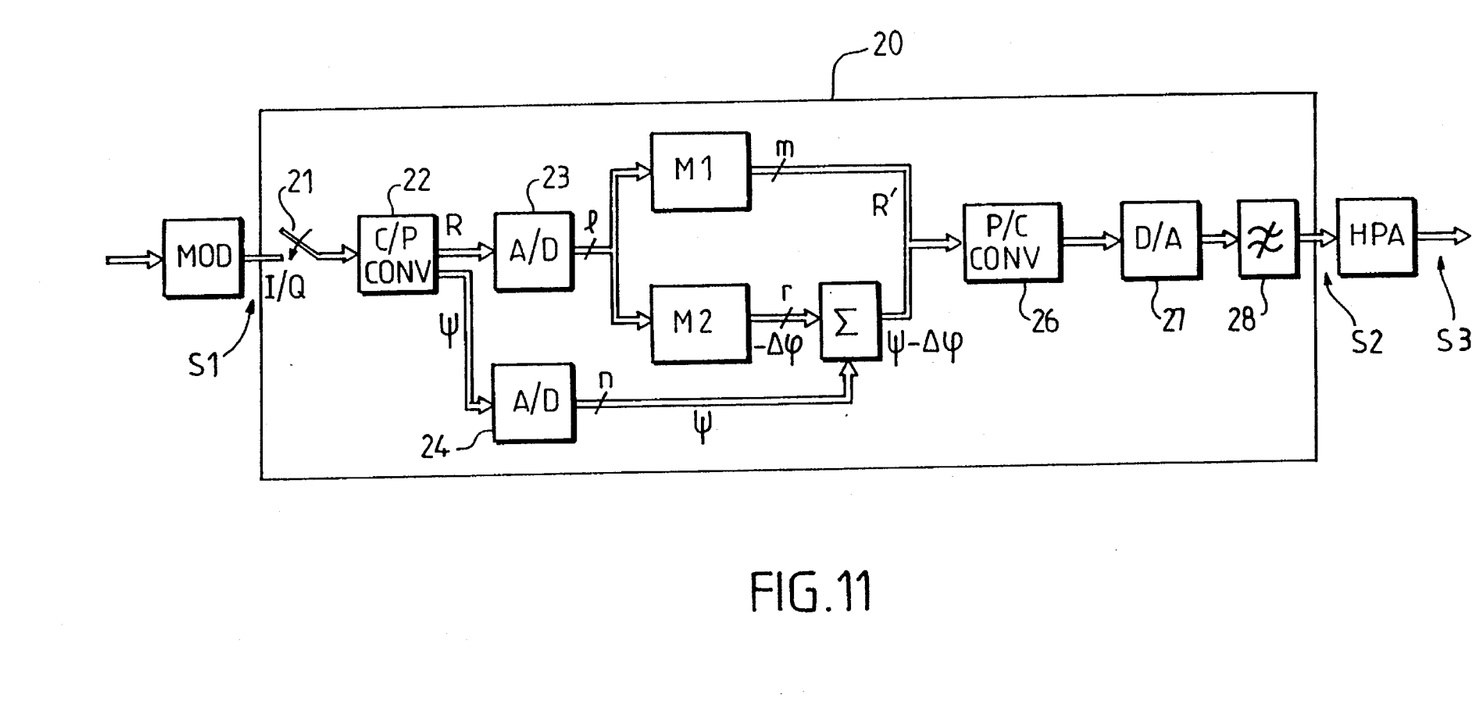
FIG. 11: a diagram of a fixed predistortion circuit according to the invention.

FIG. 11 shows a diagram of a predistortion circuit for performing the preceding conversion. Habitually, the modulator MOD supplies modulated signals having an in-phase component I and a quadrature component Q which form the OFDM signal S1. This compound signal is sampled by a sampler 21 at a rate which is a multiple of the rate of signal S1, for example, 8/Ts, where Ts is the duration of one OFDM symbol. A converter 22 performs a conversion of the cartesian coordinates I/Q to polar coordinates R, $\psi$. It is likewise possible to use a modulator which produces directly the OFDM signal S1 according to the polar coordinates R, $\psi$ in which case the converter 22 does not exist.

The converter 22 produces a sampled radial component R and a sampled in-phase component $\psi$. The radial component R is quantified with a "1" bit by a quantifier 23. These "1" bits are used for addressing two memories, M1 which produces the predistorted radial component R' corresponding to the radial component R, and M2 which produces the phase correction $-\Delta\phi$ corresponding to the radial component R.

These two memories are loaded beforehand by Tables which are established from the characteristics of the amplifier arranged upstream while these Tables are, for example, determined with the aid of FIG. 2. The memories M1 and M2 provide results quantified over m bits and r bits, respectively.

The phase component $\psi$ is also quantified over n bits by quantifier 24. To determine the real phase of point P' (FIG. 10B), the phase $\psi$ of point P is to be added to the phase offset $-\Delta\phi$ caused by the predistortion. This is performed in a summator $\Sigma$.

The predistorted radial component R' and in-phase component $(\psi-\Delta\phi)$ are converted to I/Q signals in a converter 26 which performs a reverse conversion to the one performed by the converter 22. The complex signal obtained is converted to the analog mode in a digital-analog converter 27, then filtered by a low-pass filter 28, so that the predistorted OFDM signal S2 is produced. When this signal S2 is amplified by the amplifier, the undistorted OFDM signal S3 is obtained.

Figure 12:
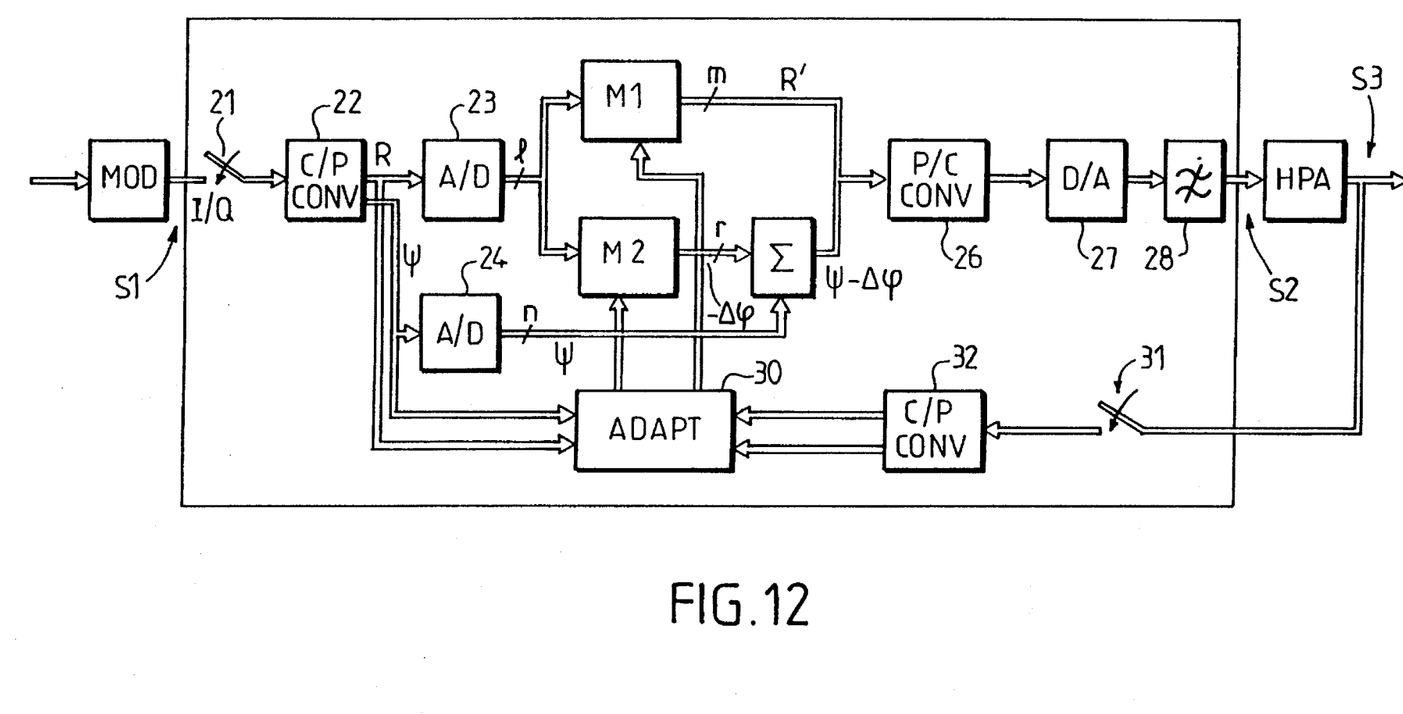
FIG. 12: a diagram of an adaptive predistortion circuit according to the invention.

The diagram of FIG. 11 corresponds to a fixed predistortion circuit. It is possible to take variations with time into account or variations with temperature of the characteristic features, more specifically, of the amplifier. Therefore, FIG. 12 represents a diagram of an adaptive predistortion circuit. Like elements of FIG. 11 are indicated by like reference characters. The modification in this case consists of comparing the signal obtained at the output of the amplifier with the signal occurring at the input, to calculate differences and consequently modify the contents of the Tables stored in the memories M1 and M2.

Therefore, an adaptation circuit 30 receives the signal S1 (after sampling 21 and conversion 22) and the signal S3 (after sampling and conversion). A sampler 31 and a cartesian/polar converter 32 perform the sampling and the conversion respectively, of signal S3. The adaptation circuit 30 finds the differences (S1–S3) and adapts the values stored in M1 and M2 to reduce these differences, for example, by a method of reducing the error gradient.

Experiments have shown that a quantification of l=8 bits i.e. a decomposition of the distribution of FIG. 6A into 256 rings, has produced satisfactory results. The radial components R' supplied by M1 were coded in m=8 bits and the phase components $\Delta\phi$ supplied by M2 were coded in r=5 bits. The memories M1 and M2 are thus to store 256 words of 8 bits and 5 bits, respectively. Thus they are small-sized memories.

At the start of the adaptive predistortion circuit it is possible to initialize the memory Tables by values $\Delta\phi=0$ for M2 and values R'=R for M1, and to make the adaptation circuit operate various times in succession, so that it determines the values of the Tables to be stored in M1 and M2. After this conversion step it is only necessary to update the Tables on occasion.

What is claimed is:

1. A digital signal transmission system operating with constellation coding, the system comprising an orthogonal frequency-division multiplexing modulation unit which receives a digital signal, multiplexes the signal, processes the multiplexed signal and generates frequency division multiplexed multicarrier signals as a combined signal, and an amplifier which causes signal distortion and has a power amplifier input, a predistortion circuit inserted between the frequency-division multiplexing modulation unit and the amplifier, said predistortion circuit predistorting the combined signal received at the power amplifier input with signal characteristics that are inverse to the distortion created by the amplifier, and generating a predistorted combined signal so that, after the predistorted multicarrier signals pass through the amplifier, the amplifier delivers undistorted multiplexed multicarrier signals.

2. System as claimed in claim 1, characterized in that the predistortion circuit predistorts the amplitude and phase of the combined signal as a function of its radial amplitude.

3. System as claimed in claim 1, characterized in that the predistortion circuit comprises:

means for sampling and quantifying the combined frequency division multiplexed multicarrier signals, means for predistorting polar amplitude and phase values of the combined frequency division multiplexed multicarrier signals, means for generating in-phase and quadrature components of the predistorted signals.

4. System as claimed in claim 3, characterized in that the predistortion circuit comprises at the input a cartesian/polar converter unit for converting the sampled signals.

5. System as claimed in claim 1, characterized in that the predistortion circuit comprises an adaptation circuit which calculates the differences between the signals of the circuit and the output signals of the amplifier and which adapts the predistortion circuit to reduce these differences.

* * * * *